United States Patent
Xu et al.

(10) Patent No.: US 10,234,979 B2
(45) Date of Patent: Mar. 19, 2019

(54) ARRAY SUBSTRATE, RELATED DISPLAY PANELS, AND RELATED DISPLAY APPARATUS

(71) Applicants: BOE TECHNOLOGY GROUP CO., LTD, Beijing (CN); BEIJING BOE OPTOELECTRONICS TECHNOLOGY CO., LTD., Beijing (CN)

(72) Inventors: Rui Xu, Beijing (CN); Xiaochuan Chen, Beijing (CN); Lei Wang, Beijing (CN); Ming Yang, Beijing (CN); Haisheng Wang, Beijing (CN); Shengji Yang, Beijing (CN); Yingming Liu, Beijing (CN); Weijie Zhao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 20 days.

(21) Appl. No.: 15/122,656

(22) PCT Filed: Sep. 15, 2015

(86) PCT No.: PCT/CN2015/089656
§ 371 (c)(1),
(2) Date: Aug. 31, 2016

(87) PCT Pub. No.: WO2017/045133
PCT Pub. Date: Mar. 23, 2017

(65) Prior Publication Data
US 2017/0269762 A1    Sep. 21, 2017

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/047* (2013.01); *G06F 3/0412* (2013.01);
(Continued)

(58) Field of Classification Search
CPC ........ G06F 3/0416; G06F 3/044; G06F 3/047; G06F 2203/04112; H01L 27/323
See application file for complete search history.

(56) References Cited

U.S. PATENT DOCUMENTS

2012/0105341 A1   5/2012  Park et al.
2012/0169636 A1*  7/2012  Liu ...................... G06F 3/0412
                                               345/173
(Continued)

FOREIGN PATENT DOCUMENTS

CN    102760405 A    10/2012
CN    103389824 A    11/2013
(Continued)

OTHER PUBLICATIONS

The World Intellectual Property Organization (WIPO) International Search Report for PCT/CN2015/089656 dated Jun. 7, 2016 p. 1-5.
(Continued)

*Primary Examiner* — Alexander Eisen
*Assistant Examiner* — Kebede T Teshome
(74) *Attorney, Agent, or Firm* — Westerman, Hattori, Daniels & Adrian, LLP (57) ABSTRACT

The present disclosure provides an array substrate for an organic light emitting diode (OLED) display panel. The array substrate includes a substrate; a thin film transistor layer comprising a plurality of thin film transistors, each including a source and a drain; and an anode layer comprising a plurality of anode electrodes for applying an anode voltage, and each connected to one of the source and the drain of a corresponding transistor. The array substrate also includes a cathode layer comprising a plurality of touch
(Continued)

electrodes insulated from one another for a time-sharing operation, wherein a cathode voltage and a touch-sensing voltage are applied on the plurality of touch electrodes.

20 Claims, 4 Drawing Sheets

(51) Int. Cl.
    *G06F 3/047* (2006.01)
    *H01L 27/32* (2006.01)

(52) U.S. Cl.
    CPC .. *H01L 27/323* (2013.01); *G06F 2203/04112* (2013.01)

(56) References Cited

U.S. PATENT DOCUMENTS

| | | | |
|---|---|---|---|
| 2015/0194470 A1* | 7/2015 | Hwang | G06F 3/044 345/173 |
| 2016/0218158 A1* | 7/2016 | Li | H01L 27/323 |
| 2017/0269745 A1 | 9/2017 | Ding et al. | |

FOREIGN PATENT DOCUMENTS

| | | | |
|---|---|---|---|
| CN | 104076966 A | | 10/2014 |
| CN | 104375305 A | * | 2/2015 |
| CN | 104850268 A | | 8/2015 |
| CN | 105493013 A | | 4/2016 |
| JP | 2001076886 A | | 3/2001 |

OTHER PUBLICATIONS

The State Intellectual Property Office of the People's Republic of China (SIPO) Office Action 1 for 201580000828.X dated Jul. 5, 2017 18 Pages (including translation).

State Intellectual Property Office of the P.R.C (SIPO) Office Action 2 for 201580000828.X dated Dec. 19, 2017 25 Pages (including translation).

* cited by examiner

ARRAY SUBSTRATE, RELATED DISPLAY PANELS, AND RELATED DISPLAY APPARATUS

CROSS-REFERENCE TO RELATED APPLICATION

This patent application is a national phase entry under 35 U.S.C. § 371 of International Application No. PCT/CN2015/089656, filed on Sep. 15, 2015, the entire content of which is incorporated by reference herein.

FIELD OF THE INVENTION

The present invention generally relates to the display technologies and, more particularly, relates to an array substrate for an organic light emitting diode (OLED) display panel, related display panels, and related display apparatus.

BACKGROUND

With the development in OLED display technologies, OLED display panels have been widely used in electronic devices such as mobile phones, tablets, and flat TVs. Compared to conventional liquid crystal display (LCD) devices, OLED display devices do not require backlight. They are also relatively thin and light, and often have a wide viewing angle and short response time. In addition, OLED display devices generally have higher light emission efficiencies.

Often, in an OLED device, the conductive organic layer for emitting light is positioned between the two electrode layers (i.e., the cathode layer and the anode layer) to form a "sandwich" shaped structure. In such an OLED device, holes are injected into the organic layer from the anode and electrons are injected into the organic layer from the cathode. Holes move toward electrons and combine with electrons in the organic layer to form excitons, i.e., a bound state of electron and hole. The decay of the excitons results in relaxation of energy, accompanied by emission of radiation, e.g., visible light.

White light OLED has been used in the OLED devices for their simple operation mechanism and potential for cost reduction. By incorporating color filters (CF) with white OLEDs, three primary colors, red, green, and blue can be realized. In such display panels or devices, the white OLEDs can be used to adjust the gray scale of the units in a display panel, and the lifetimes of the OLEDs for displaying the primary colors (i.e., red, green, and blue) are the same so that color distortion caused by different lifetimes of OLEDs with different colors can be reduced.

Meanwhile, as a human-computer interaction means, touch technology and touch screen technology have developed and matured in the past years. This is triggered by the demand from more and more touch-sensitive devices. Because of advantages such as high signal to noise ratio (SNR) and low cost of production, self-capacitance in-cell touch technology has been a focus point of many researches on touch technology. One kind of self-capacitance is based on measuring the capacitance of a single electrode with respect to ground. When a human finger or a conductive stylus is near the electrodes, the human-body capacitance changes the self-capacitance of the electrode, and the changed capacitance can be sensed by an integrated circuit (IC) connected to the electrode. Among different touch technologies, in-cell touch technology integrates the capacitance sensors within the pixel or sub-pixels of the display panel so that the display panel is not required to be bonded with an additional touch panel as in the conventional touch display panels.

Conventionally, in a self-capacitance touch and display panel, often, cathode is made of indium-tin oxide (ITO). A fixed voltage is applied across the cathode and the anode for display images and responding to touch motions. When a user touches the display panel, capacitance changes at the touched intersections may be sensed by the corresponding control IC. The location of the touch can be determined or mapped by applying various algorithms.

However, a touch sensing pattern is often required to be formed in a patterning process, which may add complexity to the fabricating process and increase the fabricating cost. Further, a touch motion may change the voltage applied on the OLEDs at the touch location and cause the electric current flowing through the OLEDs to change or fluctuate. As a result, the electric current flowing through the OLEDs on a display panel may not be stable or uniform when a human finger or a conductive stylus touches the display panel. Also, conventional ITO electrodes may have high resistivity and may slow down the responses to the touch motion.

BRIEF SUMMARY OF THE DISCLOSURE

The present disclosure provides an OLED array substrate with a cathode layer for self-capacitance in-cell touch functions combining functions for displaying images and touch sensing simultaneously.

One aspect of the present disclosure provides array substrate for an organic light emitting diode (OLED) display panel. The array substrate includes a substrate; a thin film transistor layer comprising a plurality of thin film transistors, each including a source and a drain; and an anode layer comprising a plurality of anode electrodes for applying an anode voltage. Each one of the anode electrode is connected to one of the source and the drain of a corresponding transistor. The array substrate also includes a cathode layer comprising a plurality of touch electrodes insulated from one another for a time-sharing operation, wherein a cathode voltage and a touch-sensing voltage are applied on the plurality of touch electrodes.

Optionally, the array substrate further includes a voltage-compensating circuit for compensating the anode voltage when the touch-sensing voltage is applied on the plurality of touch electrodes.

Optionally, the voltage-compensating circuit includes one or more storage capacitors for compensating the anode voltage.

Optionally, the array substrate further includes a plurality of signal lines insulated from one another, each connected to one of the plurality of touch electrodes.

Optionally, the cathode layer further includes a plurality of cathode compensating electrodes being applied with the cathode voltage when the plurality of touch electrodes is applied with the touch-sensing voltage.

Optionally, the plurality of cathode compensating electrodes are applied with the cathode voltage when the plurality of touch electrodes is applied with the cathode voltage.

Optionally, each touch electrode is separated by a gap with adjacent touch electrodes and the cathode compensating electrodes are distributed in the gaps being insulated from the plurality of touch electrodes.

Optionally, the plurality of touch electrodes is arranged in an array with a plurality of rows and a plurality of columns, a shape of each touch electrode being same as other touch electrodes.

Optionally, an area of each touch electrode is same as other touch electrodes.

Optionally, an orthographic projection area of the cathode compensating electrodes is at least partially overlapped with an area of the anode layer.

Optionally, the orthographic projection area of the cathode compensating electrodes is fully overlapped with the area of the anode layer; and an orthographic projection area of the plurality of the touch electrodes is not overlapped with the area of the anode layer.

Optionally, each one of the plurality of touch electrode has a mesh-like structure, a solid structure, or a combination of a mesh-like structure and a solid structure.

Optionally, the cathode layer is made of one or more of magnesium, aluminum, alloys of lithium, aluminum, silver, magnesium, calcium, potassium, indium, a mixture of lithium fluoride, magnesium fluoride, or lithium oxide.

Optionally, the array substrate further includes a control integrated circuit connected to the cathode layer for controlling the array substrate.

Another aspect of the present disclosure includes a display panel. The display panel incorporates the disclosed array substrate.

Another aspect of the present disclosure includes a display apparatus. The display apparatus includes the disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

The present disclosure provides an OLED array substrate used in touch-sensitive display devices. Embodiments according to the present disclosure implement a cathode layer that enables the combination of self-capacitance in-cell touch technology with display functions. Embodiments according to the present disclosure provide display devices that can display images with unimpaired brightness when sensing touch motions.

The display panel containing the OLED array substrate according to the present disclosure provides desirable touch sensitivities and can be thinner and lighter at the same time. The display panels according to the present disclosure may further be simpler, cheaper, and easier to fabricate.

One aspect of the present disclosure provides an array substrate for an organic light emitting diode (OLED) display panel. The array substrate for an organic light emitting diode (OLED) display panel includes: a substrate; a thin film transistor layer comprising a plurality of thin film transistors, each including a source and a drain; an anode layer comprising a plurality of anode electrodes for applying an anode voltage, each anode electrode being connected to one of the source and the drain of a corresponding transistor; a cathode layer comprising a plurality of touch electrodes insulated from one another for a time-sharing operation, wherein a cathode voltage and a touch-sensing voltage are applied on the plurality of touch electrodes.

Figure 1:
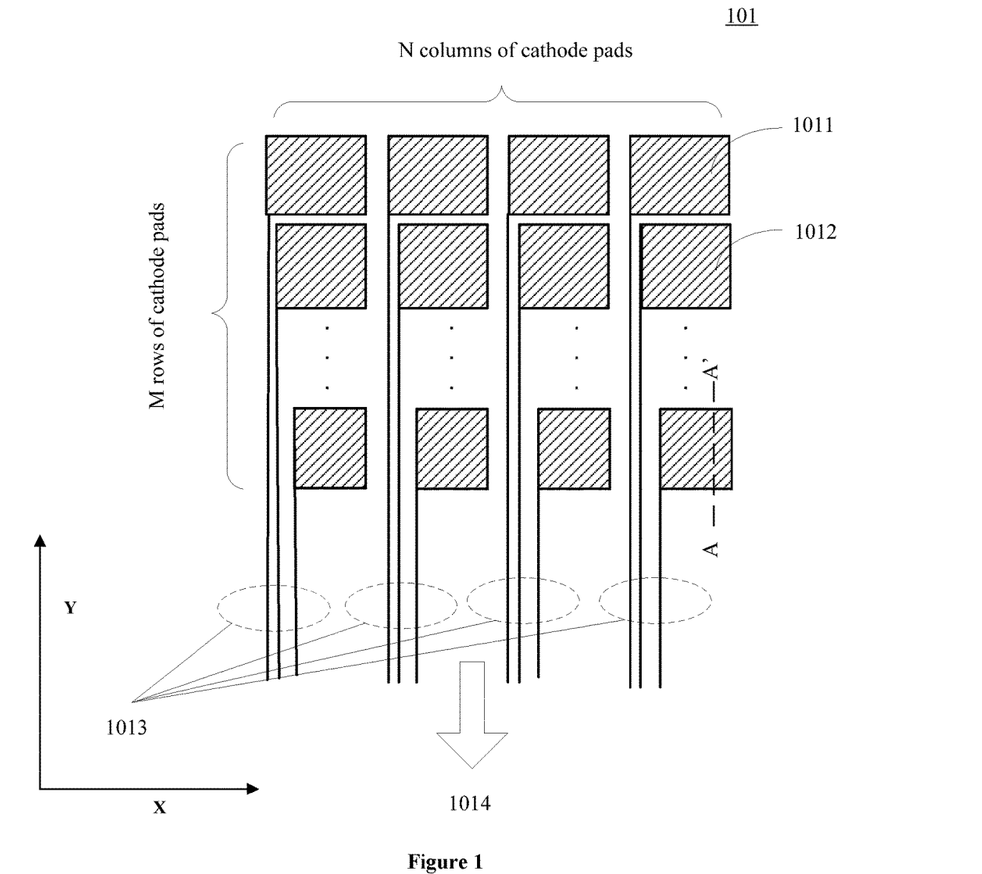
FIG. 1 illustrates the top view of an exemplary cathode layer of the OLED array substrate according to the disclosed embodiments of the present disclosure.

FIG. 1 illustrates the top view of an exemplary cathode layer 101 of the OLED array substrate provided by the present disclosure. The cathode layer 101 may correspond to a plurality of OLEDs formed on the substrate. A TFT layer with a plurality of TFTs may be included in the substrate. An anode layer, including a plurality of anode electrodes applied with an anode voltage, may be incorporated in the OLEDs or substrate. Each one of the anode electrodes may be connected to the source or drain of the corresponding TFT. The cathode layer 101 may be divided into an M (rows) by N (columns) array of cathode pads covering an entire display panel. Each cathode pad may be a touch electrode for displaying images and touch-sensing functions. In one embodiment, each cathode pad may be a self-capacitance touch electrode. The N columns of cathode pads may be arranged substantially along a horizontal axis (X-direction), and the M rows of cathode pads may be arranged substantially along a vertical axis (Y-direction), where the X-direction is perpendicular to the Y-direction. The dimension of a cathode pad may be determined or adjusted according to different designs or applications. Each one of the cathode pad may correspond to a portion an OLED or a plurality OLEDs.

Further, each cathode pad (e.g., 1011 or 1012) may be insulated from other cathode pads and may include a signal line 1013 connected to a control IC or signal processor 1014. Each cathode pad may be insulated from other cathode pads by a suitable insulating material such as resin or air. Each signal line 1013 may be insulated from other signal lines 1013 and may independently send signals reflecting capacitance or voltage change to the control IC 1014 when the corresponding cathode pad is touched. For example, in a 3 by 2 cathode pad array, 6 signal lines may be arranged to send independent voltage or capacitance signals to the control IC 1014. The signal lines 1013 may be arranged within the cathode layer or in other layers or the substrate, according to various designs and applications. Based on the signals received from all the cathode pads, the control IC 1014 can locate or map a touch motion and respond accordingly. The material of the signal lines 1013 may be chromium, barium, aluminum, titanium, alloys, etc.

The M by N cathode pads may be used for time-sharing operations. In one period of time, the cathode pads may be used only for displaying images. In another period of time, the cathode pads may be used only for sensing touch motions. Each cathode pad may be connected to a normal cathode voltage line (not shown) and a touch cathode voltage line. The anode electrodes of the OLEDs may also be connected to a normal anode voltage line. When in operation, the OLEDs of the display panel may be operated in two modes, i.e., a displaying mode and a touch-sensing mode. In the displaying mode, the display panel may be capable of only displaying images. In the touch-sensing mode, the display panel may be capable of only sensing touch motions.

Within the duration of each frame $\Delta t$, the display panel may switch between at least one of the modes. For example, in the duration of one frame $\Delta t$, the display panel may first be in the displaying mode for a duration of $\Delta t1$ and further be in the touch-sensing mode for a duration of $\Delta t2$, where $\Delta t1+\Delta t2=\Delta t$. $\Delta t1$ and $\Delta t2$ may be both positive numbers. When the next frame starts, the display panel may switch back to displaying mode and maintain in the displaying mode for $\Delta t1$, and change to the touch-sensing mode and maintain in the touch-sensing mode for $\Delta t2$. $\Delta t1$ may be much larger than $\Delta t2$. In various embodiments of the present disclosure, $\Delta t2$ may be less than 1 µs in a frame of 15.7 µs. It should also be noted that in certain other embodiments, the display panel may also switch between the display mode and the touch-sensing mode for more than once in the duration of one frame $\Delta t$. The working principles may be similar to the working principles described above.

In the displaying mode, a normal cathode voltage may be applied on all the cathode pads and a normal anode voltage may be applied on the anode layer of each OLED.

In the touch-sensing mode, a touch cathode voltage may be applied on all the cathode pads. The display panel may be able to capture any touch motion occurred during the duration of one frame $\Delta t$. The touch motion may cause the cathode voltage on the cathode pads at or near the touch location to change. The signal lines 1013 may send signals reflecting the touch motion to the control IC, and the control IC may map the location of the touch motion and respond to the touch motion.

If a touch motion occurs, the touch motion may cause the capacitance between the cathode layer, at and near the touch location, and the corresponding anode layer to change. Optionally, the anode layers of the OLEDs may be connected to a voltage-compensating circuit. The voltage-compensating circuit may include one or more storage capacitors. The storage capacitors may be used to provide compensating anode voltages to the OLEDs when the cathode voltages on the OLEDs change such that the current flowing through the OLEDs may maintain stable. The OLEDs may emit light with stable or unimpaired brightness. The anode layer may be connected to the voltage-compensating circuit for compensating the anode voltage according to the voltage changes on the corresponding cathode layer. In one embodiment, the TFTs may be top gate TFTs. According to different designs of driving circuit, the number of TFTs and the number of storage capacitors may vary. One or more TFT can be used to drive one pixel or sub-pixel, but only one TFT is drawn in FIG. 2 for illustrative purposes. In the TFT layer 2011, a gate electrode of at least one TFT may be connected to a gate line (not shown), a source or drain of the at least one TFT may be connected to a source line (not shown), and a drain or source of the at least one TFT may be connected to a corresponding bus line 2019 that further connects to an anode electrode 2015 of the corresponding anode layer. Storage capacitors may be used to charge the organic layer 2017 when the voltage applied on the organic layer 2017 decreases to ensure the organic layer emit light with proper light intensity.

The normal cathode voltage may be the same as or different from the touch cathode voltage. In one embodiment, the normal cathode voltage may be the same as the touch cathode voltage.

Because $\Delta t2$ is sufficiently small, i.e., the duration of the touch-sensing mode is sufficiently short, the display panel may still be able to display images normally. The normal display performance of the display panel is not affected by any touch motions.

The control IC 1014 may be used to control the time-sharing operation of the cathode layer and other related displaying and touch-sensing functions. The control IC 1014 may include a processor, a random access memory (RAM) unit, a read-only memory (ROM) unit, a storage unit, a display, an input/output interface unit, a database, and a communication interface. Other components may be added and certain devices may be removed without departing from the principles of the disclosed embodiments.

The signal line 1013 of each cathode pad may be arranged to connect one lower corner of the cathode pad to the control IC 1014 (not shown) along the Y-direction on a same side of each column of cathode pads such that all the signal lines 1013 may be parallel to the Y-direction. In one embodiment, as shown in FIG. 1, the cathode pads in a column (along the Y-direction) may have decreasing areas and the cathode pads along a same row (along the X-direction) may be of the same size. For example, cathode pad 1012 is smaller than cathode pad 1011. Cathode pad 1011 may have the same area as other cathode pads in the same row and cathode pad 1012 may have the same area as other cathode pads in the same row. The size of each cathode pad may be dependent on the space required for arranging the signal line(s) on one side or both sides of the cathode pads. In some other embodiments, the cathode pads along a same column (along the Y-direction) and along a same row (along the X-direction) may be of the same size. The signal lines may be arranged accordingly to be connected to the control IC 1014.

A cathode pad (e.g., 1011 or 1012) in FIG. 1 may be made of metal with a mesh-like structure or a solid structure.

Figure 2:
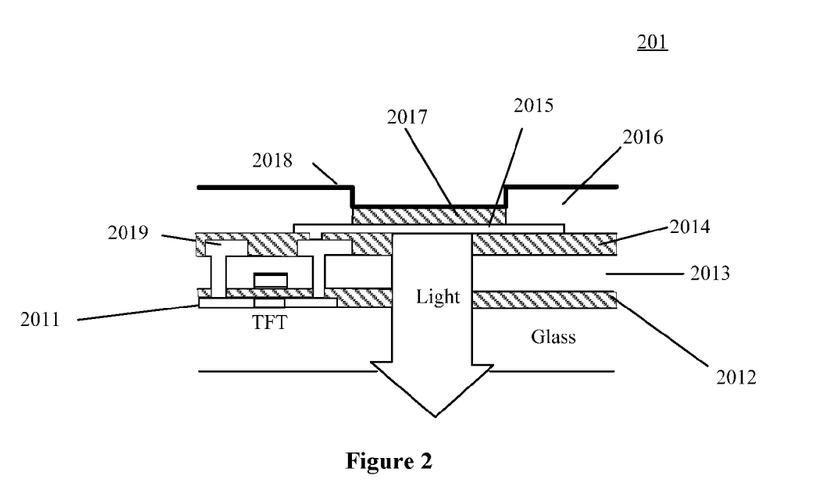
FIG. 2 illustrates an A-A' cross-section view of an exemplary pixel/sub-pixel illustrated in FIG. 1.

FIG. 2 illustrates the A-A' cross-section view of a cathode pad in FIG. 1. An exemplary pixel/sub-pixel 201 is shown. The pixel/sub-pixel 201 may include a portion of an OLED or a plurality of OLEDs. For illustrative purposes, an OLED is shown and the parts in FIG. 2 do not reflect the actual dimensions or ratios of the pixel/sub-pixel. Each cathode pad illustrated in FIG. 1 may correspond to a portion of the pixel/sub-pixel 201 or a plurality of the pixels/sub-pixels 201.

The pixel/sub-pixel 201 may include a bottom substrate, a TFT layer 2011 formed on or over the substrate, and a gate insulating (GI) layer 2012 covering the TFT layer 2011. The pixel/sub-pixel 201 may also include a passivation (PAS) layer 2013 formed on or over the GI layer 2012 and via holes corresponding to the source and/or drain regions of the TFT in the PAS layer 2013. Suitable conductive materials such as metals can be used to fill in the via holes to form bus lines 2019 connecting the source and drain of the TFT to the subsequently formed one anode electrode of an anode electrode layer 2015. The pixel/sub-pixel may also include an overcoat (OC) layer 2014 formed on or over the PAS layer 2013 to cover the bus lines 2019. A via hole may be formed in the OC layer 2014 connecting one of the bus lines 2019 to subsequently formed one anode electrode of the anode electrode layer 2015 such that at least one drain or source of a TFT is connected to the anode electrode. Suitable conductive materials such as metals may be used to fill in the via hole and the anode layer may be formed on or over the OC layer 2014. The anode layer 2015 is connected to one of the bus lines 2019 through the anode electrode. Only a portion of the anode layer 2015 corresponding to the subsequently formed organic layer may remain on or over the OC layer 2014.

The pixel/sub-pixel 201 may also include a bank layer 2016 formed to cover a portion of the surface of the anode layer 2015 and the OC layer 2014. A portion of the bank layer 2016, corresponding to a central portion of the anode layer 2015, may be removed to leave space for the subsequently formed organic layer.

The pixel/sub-pixel 201 may also include an organic layer 2017, often formed in the substantially central portion of the anode layer 2015, corresponding to the removed portion of the bank layer 2016. The pixel/sub-pixel 201 may include a cathode layer 1018 formed to cover the organic layer 2017. The bank layer 2016 may cover a peripheral portion the anode layer 2015. Additionally, a top substrate (not shown) may be formed on or over the cathode. The top substrate and/or the bottom substrate of the pixel/sub-pixel may be placed according to various designs and applications. The top and/or bottom substrates of the pixel/sub-pixel may be made of any suitable materials such as glass.

The TFT layer 2011 may be disposed on one side of the bottom substrate facing the organic layer 2017. The TFT layer 2011 may include one or more pixel driving transistors (i.e., TFTs), a plurality of gate lines (not shown), and a plurality of source lines (not shown). At least one TFT in the TFT layer 2011 may drive the corresponding pixel according to a display pixel signal and/or a display driving signal to implement display functions.

The GI layer 2012 can further provide electrical insulation between the gate of the pixel driving transistor and other components. The GI layer 2012 can be made of any suitable dielectric materials such as silicon nitride and/or silicon dioxide, and can be formed by appropriate deposition means such as plasma enhanced chemical vapor deposition (PECVD) or sputtering.

The PAS layer 2013 may be made of suitable dielectric materials such as silicon nitride and/or silicon diode to provide electrical insulation between the bus lines 2019 and the surrounding components. The PAS layer 2013 may also prevent oxygen and moisture from eroding the GI layer 2012. The PAS layer 2013 may be formed by appropriate deposition means such as PECVD or sputtering.

The bus lines 2019 may be made of a metal with low resistivity such as gold, silver, aluminum, and/or copper. The bus lines 2019 can be formed by suitable deposition means such as sputtering.

The OC layer 2014 can be made of any suitable dielectric layers such as silicon dioxide and/or silicon nitride and can be formed by any suitable deposition means such as PECVD or sputtering. The OC layer 2014 (i.e., planarization layer) may provide electrical insulation between the bus lines 2019 and the surrounding components and provide a base for the formation of the anode layer 2015 and the bank layer 2016. The top surface of the OC layer 2014 may be sufficiently flat to ensure desired adherence between the OC layer 2014 and the anode layer 2015.

The material of the anode layer 2015 can be selected based on optical transparency, electrical conductivity, and chemical stability. In one embodiment, the anode layer 2015 may be made of indium tin oxide (ITO). Excessive area of the ITO anode layer 2015 can be removed/etched so that only a suitable surface are corresponding to the organic layer 2017 can remain on the OC layer 2014. In one embodiment, the area of the anode layer 2015 can be larger than the area of the organic layer 2017. The anode layer 2015 may be connected to the corresponding drain or source of the driving transistor through a bus line 2019. In certain embodiments, the organic layer 2017 may be positioned at the central region of the anode layer 2015.

The bank layer 2016 can be used to define the area of the conductive organic layer 2017 and provide electrical insulation between the organic layer 2017 and other organic layers of surrounding organic layers or OLEDs. The bank layer 2016 can be made of any suitable photoresist and/or dielectric materials, such as silicon dioxide and silicon nitride. The bank layers 2016 can also provide a base for the formation of the cathode layer 2018.

The organic layer 2017 can be formed on the anode layer 2015 corresponding to the area defined by the bank layer 2016. The organic layer 2017 can be a single-layered structure or a bilayer structure. In one embodiment, the organic layer 2017 is a single-layered structure; the organic layer 2017 may only include a single organic layer made of an organic material such as platinum-rich polymers, for emitting white light. In another embodiment, the organic layer 2017 may be a bilayer structure; the organic layer 2017 may include an emissive layer and a conductive layer. The conductive layer may be formed to contact the anode layer 2015, and the emissive layer may be formed on the conductive layer to contact the cathode layer 2018. The emissive layer may be made of certain light-emitting dye and/or polymers with dopants. The conductive layer may be made of a highly conductive organic material. The bilayer structure may improve rate of exciton combination within the organic layer and improve quantum efficiency.

The cathode layer 2018 may correspond to at least a portion of the cathode pad illustrated in FIG. 1. The cathode layer 2018 may be made of suitable metal materials such as magnesium, and/or aluminum. The cathode layer 2018 can also be made of suitable metal alloys of lithium, aluminum, silver, magnesium, calcium, potassium, indium, or a mixture of lithium fluoride, magnesium fluoride, and lithium oxide. The cathode may be formed by suitable deposition means such as sputtering. In some embodiments, the thickness of the cathode layer 2018 may be less than 50 nm such that light generated by the organic layer 2017 and/or reflected back from the bottom substrate can pass through the cathode layer 2018 without losing significant light intensity. Thus, images can be properly shown on the top substrate.

When a voltage is applied across the OLED, electrons may be injected into the organic layer 2017 from the cathode layer 2018 and holes may be injected into the organic layer 2017 from the anode layer 2014 to combine and form excitons. The decay of excitons may emit light such as visible light. The cathode layer 2018 may have certain discrete structures to cover the entire surface of the display panel.

As shown in FIG. 2, the anode layer 2015 may have a discrete structure, i.e., not continuous along the horizontal direction. The cathode layer 2018 may extend beyond the corresponding anode layer 2015 along the horizontal direction. The organic layer 2017, the portion of the cathode layer 2018 corresponding to the organic layer 2017 and the portion of the anode layer 2015 under the organic layer 2017 may be used to emit light, i.e., to display images when the OLED array substrate is in operation.

When the pixel/sub-pixel 201 is in operation, an anode voltage is applied on the anode layer 2015 by the driving transistor. Electrical field may be formed across the organic layer 2017 such that electrons may be injected into the organic layer 2017 from the cathode layer 2018 and holes may be injected into the organic layer from the anode 2015. The combination of electrons and holes may form excitons, which further decay to emit light. When a human finger or a conductive stylus touches the cathode layer 2018, the capacitance between the cathode layer 2018 and the human finger or the conductive stylus may change. The change of capacitance may be sensed by the control (IC connected to the cathode layer 2018, and the control IC may locate the touch motion through certain algorithms and respond to the touch motion correspondingly.

The light emitted may be transmitted through the OC layer 2014, the PAS layer 2013, the TFT layer 2011, and the GI layer 2012 to the user facing the bottom glass substrate shown in FIG. 2. Alternatively, certain reflective layer (not shown) may be disposed on the bottom glass substrate and the emitted light may be reflected back from the bottom glass substrate to transmit through the cathode layer 2018 and to the user facing the cathode layer 2018. In one embodiment, the emitted light is reflected back from the bottom glass substrate and transmitted through the cathode layer 2018 to users facing the cathode layer 2018.

It should be noted that, the cathode layer 2018, the bank layer 2016, the anode layer 2015, the OC layer 2014, the PAS layer 2013, and the GI layer 2012 may need to be substantially transparent to minimize intensity loss of the light emitted by the organic layer 2017. The dimensions and thickness of the cathode layer 2018, the organic layer 2017, the anode layer 2015, the bank layer 2016, the OC layer 2014, the PAS layer 2013, the GI layer 2012, and the formation of the TFT layer 2011 are based on applications and designs and known to those skilled in the art, and are thus omitted herein.

Figure 3:
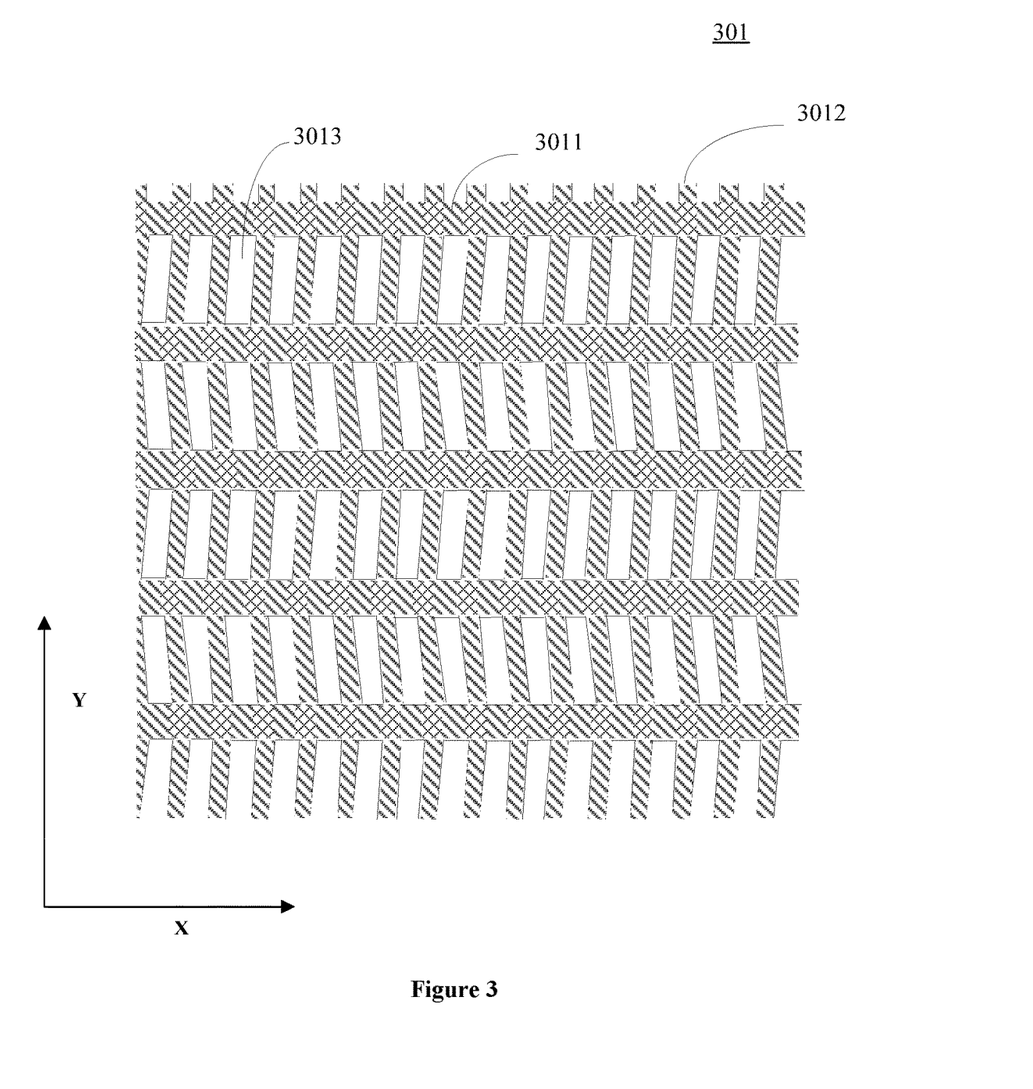
FIG. 3 illustrates an exemplary configuration of the cathode layer illustrated in FIG. 1.

In one embodiment, the cathode pad included in the cathode layer 2018 may have a mesh-like structure. As shown in FIG. 3, the mesh-like structure 301 may include a first region and a second region. The first region may include the repeating horizontal cathode stripes 3011 arranged along the X-axis and the repeating vertical cathode stripes 3012 arranged along the Y-axis. The second region 3013 may include the polygonal regions not covered with cathode stripes, such as cathode stripes 3011 and 3012. The width of a stripe may be about a few microns. The second region 3013 may be filled with suitable insulating materials such as resin and/or air. The resin may be substantially transparent to minimize intensity loss of the light emitted. Each horizontal cathode stripe 3011 may be electrically conductive to each vertical cathode stripe 3012.

Figure 4:
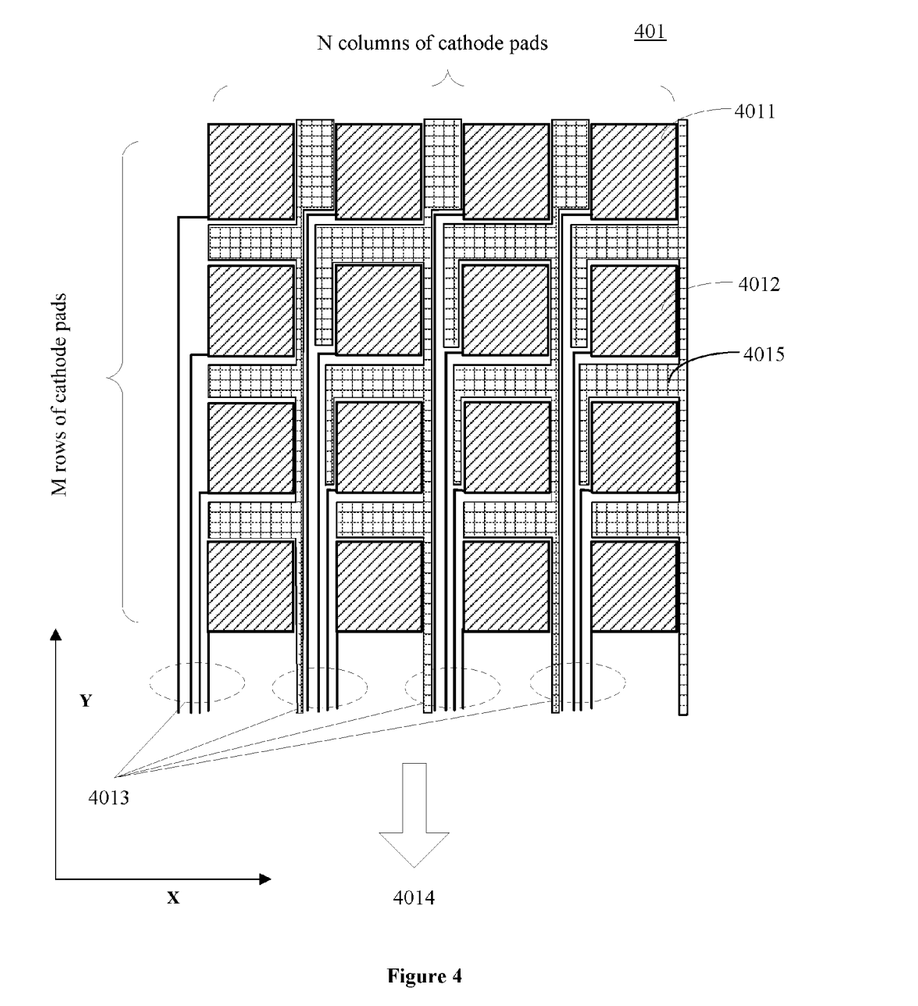
FIG. 4 illustrates the top view of another exemplary cathode layer of the OLED array substrate according to the disclosed embodiments of the present disclosure.

FIG. 4 illustrates the top view of another exemplary cathode layer of the OLED array substrate provided by the present disclosure. In the cathode layer shown in FIG. 4, the cathode layer 401 may be divided into an M by N array of cathode pads. The N columns of cathode pads may be arranged substantially along a horizontal axis (X-direction), and the M rows of cathode pads may be arranged substantially along a vertical axis (Y-direction). The X-direction is perpendicular to the Y-direction.

In one embodiment, all the cathode pads in the display panel, along the X-direction and along the Y-direction, may be of the same shape. In various embodiments of the present disclosure, each cathode pad may have the same size. In certain other embodiments, the cathode pads in a row or in a column may have varying sizes. The signal lines may be arranged according to different arrangement of the cathode pads to ensure each signal line is insulated from other signal lines, and each signal line may transmit signals independently to the control IC 4014. The sizes of the cathode pads may be subjected to different applications and should not be limited by the embodiments herein.

Further, compared to the cathode layer illustrated in FIG. 1, each cathode pad may be insulated from other cathode pads and be separated by a gap. A solid cathode region 4015 may be formed in the gap between two adjacent cathode pads. Each solid cathode region 4015 may be a cathode compensating electrode. The solid cathode regions 4015 may be insulated from the cathode pads. Each solid cathode region 4015 may correspond to a portion of the pixel/sub-pixel or a plurality of pixels/sub-pixels illustrated in FIG. 2. Signal lines 4013, spatially separate and electrically insulated from each other, each being surrounded by the solid cathode regions 4015. Suitable electrically insulating materials such as resin or air may be used to fill in the space/boundaries between a cathode pad and the surrounding solid cathode regions 4015, and between a signal line and surrounding solid cathode regions. Each cathode pad may be electrically insulated from other cathode pads and solid cathode regions. Thus, each cathode pad may function independently and each signal line may send signals to the control IC 4014 independently.

In operation, the plurality of cathode compensating electrodes of the cathode layer, i.e., the solid cathode regions, may be applied with a normal cathode voltage when the plurality of touch electrodes are applied with a touch-sensing voltage. The plurality of cathode compensating electrodes are applied with the normal cathode voltage when the plurality of touch electrodes are applied with the normal cathode voltage.

In one embodiment, the orthographic projection of the solid cathode regions may be at least partially overlapped with the area of the anode layers. In another embodiment, the orthographic projection area of the cathode compensating electrodes (i.e., the solid cathode regions) may be fully overlapped with the area of the anode layer; and a orthographic projection area of the plurality of the touch electrodes is not overlapped with the area of the anode layer.

The solid cathode regions 4015 may only be used for only displaying images. Each solid cathode region may be connected to a normal cathode voltage line. The anode layers of the OLEDs corresponding to the solid cathode regions may be connected to a normal anode voltage line. The orthographic projection of the solid cathode regions may be at least partially overlapped with the area of the anode layers to ensure the current flowing through the OLEDs at or near the touch location may be stable, so that the OLEDs may emit light with desired intensity or brightness. In one embodiment, the orthographic projection of each solid cathode region may be fully overlapped with the area of the corresponding anode layer, and the orthographic projection area of the cathode pads is not overlapped with the area of the anode layers.

Each cathode pad may be a touch electrode and may be used for at least touch-sensing functions. In one embodiment, each cathode pad may be a self-capacitance touch electrode. Each cathode pad may be connected to a touch cathode voltage line and a normal cathode voltage line. The cathode pads may be used only for touch-sensing functions.

The array substrate containing the cathode layer of FIG. 4 may be used for a time-sharing operation. That is, the array substrate may also have at least a displaying mode and a touch-sensing mode. Different from the array substrate shown in FIG. 1, for the array substrate shown in FIG. 4, in the touch-sensing mode, the display panel may also be capable of display images. In the duration of one frame Δt, the display panel 401 may also be operated in the displaying mode for a duration of at least Δt1, and be operated in the touch-sensing mode for a duration of at least Δt2. In one embodiment, Δt1+Δt2=Δt. That is, in the duration of one frame Δt, the display panel 401 may be in the displaying mode first and further switch to the touch-sensing mode. The display panel 401 may switch back to the displaying mode when the next frame starts. Alternatively, in the duration of one frame Δt, the display panel 401 may be in the touch-sensing mode first and switch to the display mode. In certain other embodiments, the display panel 401 may switch between the displaying mode and the touch-sensing mode for more than once in the duration of one frame Δt, i.e., Δt1+Δt2<Δt. Δt1 and Δt2 may be both positive numbers. The display panel may be able to capture any touch motion occurred during the duration of one frame Δt. It should be noted that, in this case, Δt2 can be longer or even comparable to Δt1. The length of the displaying mode and/or the touch-sensing mode, and the specific order of the display mode and the touch-sensing mode may be subjected to different applications and designs and should not be limited by the embodiments herein.

When the display panel 401 is operated in displaying mode, a normal cathode voltage may be applied on the solid cathode regions and on the cathode pads through the normal cathode voltage lines. The OLEDs corresponding to the solid cathode regions may emit light with desired brightness. Because the organic layers and the corresponding anode layers are only formed under the solid cathode regions, when in displaying mode, the light of the display panel is emitted only by the OLEDs corresponding to the solid cathode regions.

When the display panel 401 is operated in touch-sensing mode, a touch voltage may be applied on the cathode pads through the touch cathode voltage lines, and a compensating cathode voltage may be applied on the solid cathode regions. The compensating cathode voltage may be equal to the normal cathode voltage. When a human finger or a conductive stylus touches the cathode layer, a normal cathode voltage may be applied on the solid cathode regions, and the cathode compensating electrodes overlap with the area of the anode layer such that the current flowing through the OLEDs at or near the touch location may emit light with desired or normal brightness. Meanwhile, a touch cathode voltage may be applied on the cathode pads. The capacitance between the cathode pads and the human finger or a conductive stylus may change, and signals reflecting the touch motion are sent to the control IC 4014. The control IC 4014 may respond accordingly. The touch cathode voltage may be the same as or different from the normal cathode voltage. During the touch motion, the orthographic projection area of the solid cathode regions at or near the touch location may be fully overlapped with the area of the corresponding anode layers.

In certain embodiments, a voltage-compensating circuit may be connected to the anode layers. The voltage-compensating circuit may include one or more storage capacitors. The storage capacitors may be used to provide compensating anode voltages to the OLEDs when the cathode voltages on the OLEDs change such that the current flowing through the OLEDs may maintain stable. The OLEDs may emit light with stable or unimpaired brightness. The compensation of the anode voltage may be controlled by the control IC 4014 according to the voltage changes on the corresponding cathode layer.

In one embodiment, the cathode pads may be made of metal and may have a mesh-like structure. In other various embodiments, the cathode pads may also have a solid structure.

In one embodiment, the cathode pads in a same column may have the same shape. In one embodiment, the cathode pads in a same column may have a same size. In certain other embodiments, the cathode pads in a same column may have a varying size, e.g., decreasing size. The specific size arrangement of the cathode pads may be subjected to different designs or applications and should not be limited by the embodiments herein.

The control IC 4014 may be used to control the timing within the duration of each frame and other related displaying and touch-sensing functions. The control IC 4014 may include a processor, a random access memory (RAM) unit, a read-only memory (ROM) unit, a storage unit, a display, an input/output interface unit, a database, and a communication interface. Other components may be added and certain devices may be removed without departing from the principles of the disclosed embodiments.

Comparing to the array substrate illustrated in FIG. 1, the array substrate illustrated in FIG. 4 may have a lower resolution for displaying functions and touch-sensing functions. Within a same area on the display panel, the display panel according to FIG. 1 may have a greater portion of area with touch-sensing functions and displaying functions. The display panel incorporating the array structure in FIG. 1 may thus have a higher touch-sensing resolution and displaying resolution compared to the display panel incorporating the array structure in FIG. 4.

The disclosed array substrate for self-capacitance in-cell touch functions combines functions for displaying images and touch sensing. In one case, the array substrate has only the displaying function in one period of time and has only the touch-sensing function in another period of time. Because the duration of the touch-sensing function is sufficiently small in each frame, when a user touches the display panel incorporating the disclosed array substrate, normal displaying function of the display panel are not affected by the touch motion. In another case, the array substrate is capable of displaying functions and touch-sensing functions simultaneously. When a user touches the display panel incorporating the disclosed array substrate, a voltage-compensating circuit may be used to stabilize the voltage applied on the organic layers corresponding to the touched cathode layer to ensure the organic layers emit light with stable brightness. By using metal as the cathode material, cathode resistivity and fabrication cost can be reduced and touch-sensing responses can be faster. Accordingly, touch-sensing performance can be improved and fabrication yield can be improved.

Embodiments according to the present disclosure also provide a display panel. The display panel includes the disclosed cathode layer, an organic layer, an anode layer, a TFT layer with at least one TFT connected to the anode layer. In some embodiments, the display panel may also include at least one storage capacitor for charging/compensating the voltage change on the anode layer when the cathode layer is touched. The display panel may also include a plurality of signal lines for connecting the cathode with a control IC to determine the location of a touch motion. Thus, the display panel may sense touch motions when displaying images with normal light intensity.

Another aspect of the present disclosure provides a display apparatus. The display apparatus incorporates the disclosed display panel. Exemplarily, the display apparatus according to the embodiments of the present disclosure can be used in any product with display functions such as a television, an LCD, an OLED, an electronic paper, a digital photo frame, a mobile phone, a tablet computer, and a navigation device.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate for an organic light emitting diode (OLED) display panel, comprising:
    a substrate;
    a thin film transistor layer comprising a plurality of thin film transistors, each including a source and a drain;
    an anode layer comprising a plurality of anode electrodes for applying an anode voltage, each of the anode electrodes being connected to the source or the drain of a corresponding thin film transistor; and
    a cathode layer comprising a plurality of touch electrodes insulated from one another for a time-sharing operation, wherein a cathode voltage and a touch-sensing voltage are applied on the plurality of touch electrodes; and
    wherein the cathode layer further includes a plurality of cathode compensating electrodes being applied with the cathode voltage when the plurality of touch electrodes is applied with the touch-sensing voltage.

2. The array substrate according to claim 1, further including a voltage-compensating circuit for compensating the anode voltage when the touch-sensing voltage is applied on the plurality of touch electrodes.

3. The array substrate according to claim 2, wherein the voltage-compensating circuit includes one or more storage capacitors for compensating the anode voltage.

4. The array substrate according to claim 1, further including a plurality of signal lines insulated from one another, each connected to one of the plurality of touch electrodes.

5. The array substrate according to claim 1, wherein the plurality of cathode compensating electrodes is applied with the cathode voltage when the plurality of touch electrodes is applied with the cathode voltage.

6. The array substrate according to claim 1, wherein each of the touch electrodes is separated by a gap with adjacent touch electrodes and the cathode compensating electrodes are distributed in the gaps and insulated from the plurality of touch electrodes.

7. The array structure according to claim 1, wherein the plurality of touch electrodes is arranged in an array with a plurality of rows and a plurality of columns, a shape of each of the touch electrodes being same as those of other touch electrodes.

8. The array substrate according to claim 1, wherein an area of each of the touch electrodes is same as those of other touch electrodes.

9. The array substrate according to claim 1, wherein an orthographic projection area of the cathode compensating electrodes is at least partially overlapped with an area of the anode layer.

10. The array substrate according to claim 9, wherein:
    the orthographic projection area of the cathode compensating electrodes is fully overlapped with the area of the anode layer; and
    an orthographic projection area of the plurality of the touch electrodes is not overlapped with the area of the anode layer.

11. The array structure according to claim 1, wherein each one of the plurality of touch electrodes has a mesh-like structure, a solid structure, or a combination of a mesh-like structure and a solid structure.

12. The array structure according to claim 1, wherein the cathode layer is made of one or more of magnesium, aluminum, alloys of lithium, aluminum, silver, magnesium, calcium, potassium, indium, a mixture of lithium fluoride, magnesium fluoride, or lithium oxide.

13. The array substrate according to claim 1, further including a control integrated circuit connected to the cathode layer for controlling the array substrate.

14. A display panel, including the array substrate of claim 1.

15. A display apparatus, including the display panel of claim 14.

16. An array substrate for an organic light emitting diode (OLED) display panel, comprising:
    a substrate;
    a thin film transistor layer comprising a plurality of thin film transistors, each including a source and a drain;
    an anode layer comprising a plurality of anode electrodes for applying an anode voltage, each anode electrode being connected to one of the source and the drain of a corresponding thin film transistor; and
    a cathode layer comprising:
        a plurality of touch electrodes arranged in an array and insulated from one another; and
        a plurality of cathode compensating electrodes insulated from the plurality of touch electrodes,
    wherein a cathode voltage and a touch-sensing voltage are applied on the plurality of touch electrodes during different periods of time, respectively, and the cathode voltage is applied on the plurality of cathode compensating electrodes when the plurality of touch electrodes are applied with the touch-sensing voltage.

17. The array substrate according to claim 16, wherein the plurality of cathode compensating electrodes is applied with the cathode voltage when the plurality of touch electrodes is applied with the cathode voltage.

18. The array substrate according to claim 16, wherein each of the touch electrodes is separated by a gap with the adjacent touch electrodes and the cathode compensating electrodes are distributed in the gaps and insulated from the plurality of touch electrodes.

19. The array substrate according to claim 16, wherein an orthographic projection area of the cathode compensating electrodes is at least partially overlapped with an area of the anode layer.

20. The array substrate according to claim 19, wherein:
    the orthographic projection area of the cathode compensating electrodes is fully overlapped with the area of the anode layer; and
    an orthographic projection area of the plurality of the touch electrodes is not overlapped with the area of the anode layer.

* * * * *